United States Patent
Cao

(10) Patent No.: US 10,921,662 B2
(45) Date of Patent: Feb. 16, 2021

(54) MANUFACTURING METHOD OF ARRAY SUBSTRATE, ARRAY SUBSTRATE, DISPLAY PANEL AND DISPLAY DEVICE

(71) Applicants: Hefei Xinsheng Optoelectronics Technology Co., Ltd., Anhui (CN);
BOE Technology Group Co., Ltd., Beijing (CN)

(72) Inventor: Binbin Cao, Beijing (CN)

(73) Assignees: Hefei Xinsheng Optoelectronics Technology Co., Ltd., Anhui (CN);
BOE Technology Group Co., Ltd., Beijing (CN)

( * ) Notice: Subject to any disclaimer, the term of this patent is extended or adjusted under 35 U.S.C. 154(b) by 10 days.

(21) Appl. No.: 16/335,837

(22) PCT Filed: Jul. 5, 2018

(86) PCT No.: PCT/CN2018/094703
§ 371 (c)(1),
(2) Date: Mar. 22, 2019

(87) PCT Pub. No.: WO2019/052270
PCT Pub. Date: Mar. 21, 2019

(65) Prior Publication Data
US 2020/0019030 A1      Jan. 16, 2020

(30) Foreign Application Priority Data

Sep. 15, 2017   (CN) .......................... 201710832900.6

(51) Int. Cl.
*G02F 1/1362* (2006.01)
*G02F 1/1368* (2006.01)
*H01L 27/12* (2006.01)

(52) U.S. Cl.
CPC ...... *G02F 1/136209* (2013.01); *G02F 1/1368* (2013.01); *H01L 27/1214* (2013.01); *H01L 27/1259* (2013.01)

(58) Field of Classification Search
None
See application file for complete search history.

(56) References Cited

U.S. PATENT DOCUMENTS 6,117,618 A * 9/2000 Yedur ..................... G03F 7/091
257/E21.029
2015/0253637 A1   9/2015 Shen
(Continued)

FOREIGN PATENT DOCUMENTS

| CN | 103149760 A | 6/2013 |
| CN | 103941505 A | 7/2014 |

(Continued)

OTHER PUBLICATIONS

Translation of WO2012050006A1 (Year: 2020).*
(Continued)

*Primary Examiner* — Phu Vu
(74) *Attorney, Agent, or Firm* — Fay Sharpe LLP

(57) ABSTRACT

The present disclosure discloses a manufacturing method of an array substrate, an array substrate, a display panel and a display device. The manufacturing method comprises: forming a shielding layer on a base substrate, wherein the shielding layer absorbs light and is made of photoresist; and forming a transistor device layer on the base substrate on which the shielding layer is formed, wherein an orthographic projection of a conductor in the transistor device layer on the base substrate is within an orthographic projection of the shielding layer on the base substrate. The shielding layer can prevent external light from irradiating the conductor in the transistor device layer, and can absorb external light. In addition, the manufacturing process is simple.

17 Claims, 15 Drawing Sheets

(56) References Cited

U.S. PATENT DOCUMENTS

2016/0141314 A1    5/2016  Zhang et al.
2017/0269421 A1*   9/2017  Oka .................. G02F 1/133305
2018/0031877 A1    2/2018  Li
2018/0149900 A1    5/2018  Ge

FOREIGN PATENT DOCUMENTS

| CN | 105404048 A | 3/2016 |
| CN | 105633016 A | 6/2016 |
| CN | 106129071 A | 11/2016 |
| CN | 106711153 A | 5/2017 |
| CN | 107634070 A | 1/2018 |
| WO | WO2012/050006 A1 | 4/2012 |

OTHER PUBLICATIONS

First office action of Chinese application No. 201710832900.6 dated Jul. 17, 2019.
ISR of international application No. PCT/CN2018/094703 (including written opinion) and English translation thereof dated Sep. 30, 2018.
Second office action of Chinese application No. 201710832900.6 dated Jan. 22, 2020.

\* cited by examiner

MANUFACTURING METHOD OF ARRAY SUBSTRATE, ARRAY SUBSTRATE, DISPLAY PANEL AND DISPLAY DEVICE

CROSS-REFERENCE TO RELATED APPLICATION

This present disclosure is a 371 of PCT Patent Application Serial No. PCT/CN2018/094703, filed Jul. 5, 2018, which claims priority to Chinese Patent Application No. 201710832900.6, filed on Sep. 15, 2017, the entire contents of which are incorporated herein by reference as part of the present disclosure.

TECHNICAL FIELD

The present disclosure relates to a manufacturing method of an array substrate, an array substrate, a display panel and a display device.

BACKGROUND

To increase the size of a display panel on the premise of not increasing the size of an electronic device, more and more manufacturers have been focusing on studying frameless display panels.

Currently, most frameless display panels are manufactured by exchanging the position of the array substrate and the position of the color film substrate in the traditional LCD (Liquid Crystal Display). Here, the color film substrate is close to the light-incident side of the liquid crystal display panel (that is, the color film substrate is at the side, close to the backlight source, of the liquid crystal display panel), and the array substrate is close to the light-emitting side of the liquid crystal display panel (that is, the array substrate is at the side, away from the backlight source, of the liquid crystal display panel). Since the area of the array substrate is larger than that of the color film substrate, a printed circuit board in the display panel does not need to be bent when connected to the array substrate. Thus, four sides of the display panel have no frames.

SUMMARY

The present disclosure provides a manufacturing method of an array substrate, an array substrate, a display panel and a display device. The technical solutions are as follows:

in a first aspect, there is provided a manufacturing method of an array substrate, comprising: forming a shielding layer on a base substrate, wherein the shielding layer absorbs light and is made of photoresist; and forming a transistor device layer on the base substrate on which the shielding layer is formed, wherein an orthographic projection of a conductor in the transistor device layer on the base substrate is within an orthographic projection of the shielding layer on the base substrate.

Optionally, forming the shielding layer on the base substrate comprises: forming a first photoresist pattern on the base substrate; and processing the first photoresist pattern to form the shielding layer.

Optionally, processing the first photoresist pattern comprises: carbonizing the first photoresist pattern.

Optionally, carbonizing the first photoresist pattern comprises: heating the first photoresist pattern in an oxygen-free environment.

Optionally, heating the first photoresist pattern comprises: bombarding the first photoresist pattern with ions to heat the first photoresist pattern.

Optionally, forming the first photoresist pattern on the base substrate comprises: sequentially forming a common electrode film and a photoresist film on the base substrate; performing exposure and developing on the photoresist film to form a second photoresist pattern, the second photoresist pattern comprising a first photoresist region and a second photoresist region, and photoresist in the first photoresist region being thicker than photoresist in the second photoresist region; removing a portion of the common electrode film which is not covered by the second photoresist pattern to form a common electrode; and removing the photoresist in the second photoresist region, and thinning the photoresist in the first photoresist region to form the first photoresist pattern.

Optionally, removing the portion of the common electrode film which is not covered by the second photoresist pattern comprises: etching the portion of the common electrode film which is not covered by the second photoresist pattern to remove the portion of the common electrode film which is not covered by the second photoresist pattern.

Optionally, removing the photoresist in the second photoresist region, and thinning the photoresist in the first photoresist region comprises: performing an ashing process on the second photoresist pattern to remove the photoresist in the second photoresist region and to thin the photoresist in the first photoresist region.

Optionally, forming a transistor device layer on the base substrate on which the shielding layer is formed comprises: sequentially forming a gate conducting layer, a gate insulating layer, an active layer and a source/drain conducting layer on the base substrate on which the shielding layer is formed, wherein the conductor in the thin film transistor device layer comprises the gate conducting layer and the source/drain conducting layer.

Optionally, after forming the transistor device layer on the base substrate on which the shielding layer is formed the method further comprises: sequentially forming a passivation layer and a pixel electrode on the transistor device layer.

In a second aspect, there is provided an array substrate. The array substrate comprises: a base substrate, and a shielding layer and a transistor device layer sequentially disposed on the base substrate along a direction away from the base substrate, wherein an orthographic projection of a conductor in the transistor device layer on the base substrate is within an orthographic projection of the shielding layer on the base substrate, and the shielding layer absorbs light and is made of photoresist.

Optionally, the transistor device layer comprises a gate conducting layer, a gate insulating layer, an active layer and a source/drain conducting layer which are sequentially disposed on the shielding layer along the direction away from the base substrate; and the conductor in the transistor device layer comprises: the gate conducting layer and the source/drain conducting layer.

Optionally, the shielding layer is 100-1,000 nm in thickness.

Optionally, the array substrate further comprises: a common electrode between the base substrate and the shielding layer, wherein an orthographic projection of the shielding layer on the base substrate is within an orthographic projection of the common electrode on the base substrate.

Optionally, the array substrate further comprises a passivation layer and a pixel electrode sequentially disposed on the transistor device layer along the direction away from the base substrate.

In a third aspect, there is provided a display panel, comprising any one of the array substrates in the second aspect.

Optionally, the display panel further comprises a color film substrate wherein the color film substrate, the liquid crystal layer and the array substrate are sequentially disposed, and the transistor device layer in the array substrate is closer to the color film substrate than the shielding layer in the array substrate.

In a fourth aspect, there is provided a display device, comprising: a backlight source and the display panel in the third aspect, wherein the backlight source is at a side, away from the array substrate, of the color film substrate of the display panel.

DETAILED DESCRIPTION

The embodiments of the present disclosure will be described in further detail with reference to the accompanying drawings, to clearly present the principles, technical solutions, and advantages of the present disclosure.

As known to the inventors, if the position of the array substrate and the position of the color film substrate in a traditional LCD are exchanged to manufacture a display panel, the display panel has the following problem: the gate conducting layer, the source/drain conducting layer and other conductors in the array substrate may reflect light outside the LCD to lead to a relatively poorer display effect of the display panel. To solve this problem, in an array substrate known to the inventors, an anti-reflective film is formed below the gate conducting layer and the source/drain conducting layer (i.e., the side, closer to the base substrate, than the gate conducting layer and the source/drain conducting layer) by means of a magnetron sputtering process. The anti-reflective film is made from a metal oxide or a metal nitride oxide. The anti-reflective film can absorb light outside the LCD and prevent the light outside the LCD from irradiating the gate conducting layer and the source/drain conducting layer, such that reflections of the gate conducting layer and the source/drain conducting layer to the external light can be reduced (this process is also called an anti-reflective treatment on the gate conducting layer and the source/drain conducting layer).

However, during actual manufacture, the thickness and ingredients of the anti-reflective film are difficult to be controlled continuously and stably for a long time. In addition, the device adopted for the anti-reflective treatment needs to be maintained frequently. Therefore, the process for manufacturing the array substrate is relatively complicated, resulting in a relatively higher manufacturing cost of the array substrate.

Figure 1:
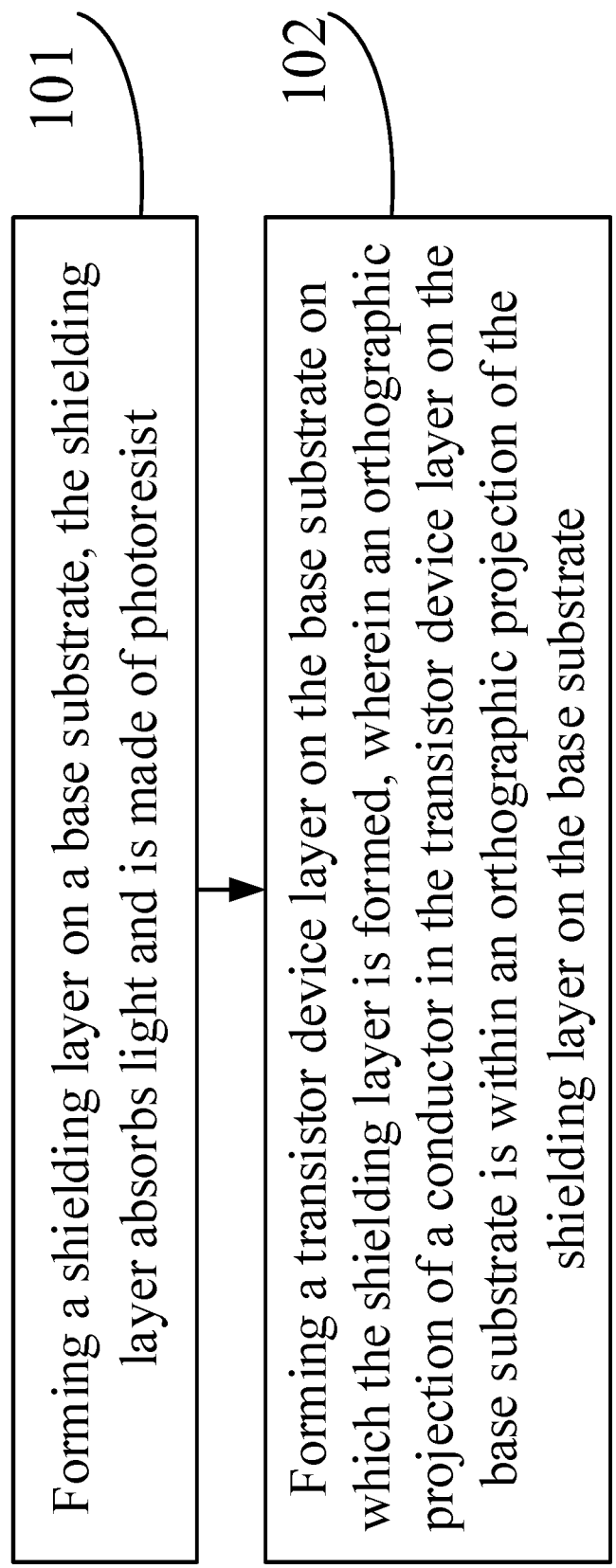
FIG. 1 is a flow chart of a manufacturing method of an array substrate according to an embodiment of the present disclosure.

FIG. 1 is a flow chart of a manufacturing method of an array substrate according to an embodiment of the present disclosure. As shown in FIG. 1, the manufacturing method of an array substrate may include the following step.

In step 101, a shielding layer is formed on a base substrate. The shielding layer absorbs light and is made of photoresist.

In step 102, a transistor device layer is formed on the base substrate on which the shielding layer is formed. An orthographic projection of a conductor in the transistor device layer on the base substrate is within an orthographic projection of the shielding layer on the base substrate.

Optionally, the conductor in the transistor device layer may generally include a gate conducting layer and a source/drain conducting layer. Furthermore, the gate conducting layer may include a gate and a gate line, and the source/drain conducting layer may include a source, a drain and a data line.

In summary, in the manufacturing method of the array substrate according to the embodiment of the present disclosure, the shielding layer and the transistor device layer are sequentially formed on the base substrate, and the orthographic projection of the conductor in the transistor device layer on the base substrate is within the orthographic projection of the shielding layer on the base substrate. As the shielding layer absorbs light and is between the base substrate and the transistor device layer, the shielding layer can prevent external light of the display device where the array substrate is located from irradiating the conductor in the transistor device layer, and can absorb the external light. Thus, light reflections at the side of the array substrate where the base substrate is located is eliminated. In addition, the shielding layer is made of photoresist and is relatively simple in forming process. Therefore, there is no need to perform the anti-reflective treatment on the transistor device layer. Thus, the process for manufacturing the array substrate is simplified.

Figure 2:
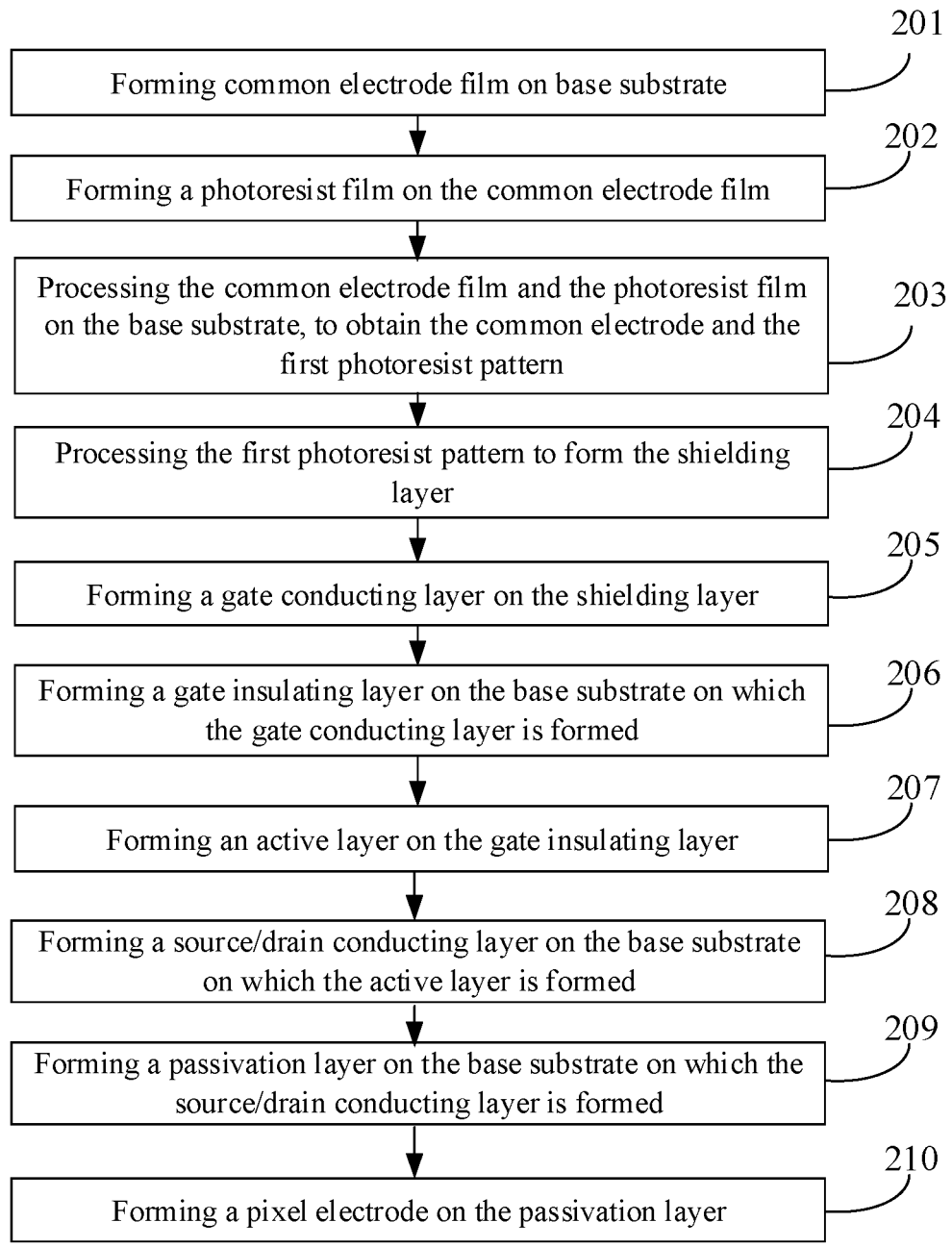
FIG. 2 is a flow chart of another manufacturing method of an array substrate according to an embodiment of the present disclosure.

Referring to FIG. 2, which is a flow chart of another manufacturing method of an array substrate according to the embodiment of the present disclosure. The manufacturing method of the array substrate may include the following steps.

In step 201, a common electrode film is formed on base substrate.

In an optional implementation, there may be various kinds of array substrates, the structures of the array substrates may be different. For example, the array substrate may be a Twisted Nematic (TN) array substrate, an Advanced Super Dimension Switch (ADS) array substrate or the like. In the embodiment shown in FIG. 2, by taking the manufacture of the ADS array substrate as an example, as the ADS array substrate has both a common electrode and a pixel electrode, a common electrode film configured to manufacture the common electrode needs to be formed first on the base substrate in the embodiment of the present disclosure.

Optionally, the common electrode film may be made from Indium Tin Oxide (ITO).

Figure 3:
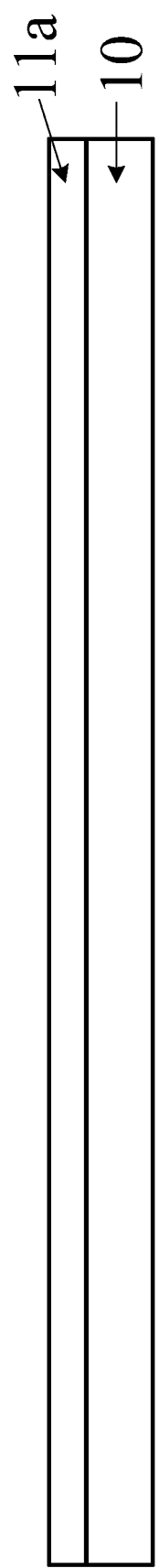
FIG. 3 is a schematic diagram showing forming of a common electrode film according to an embodiment of the present disclosure.

Exemplarily, referring to FIG. 3, which is a schematic view showing forming of the common electrode film according to an embodiment of the present disclosure, the common electrode film 11a may be formed on the base substrate 10 by means of any of deposition, coating, sputtering, etc in step 201.

In step 202, a photoresist film is formed on the common electrode film.

Figure 4:
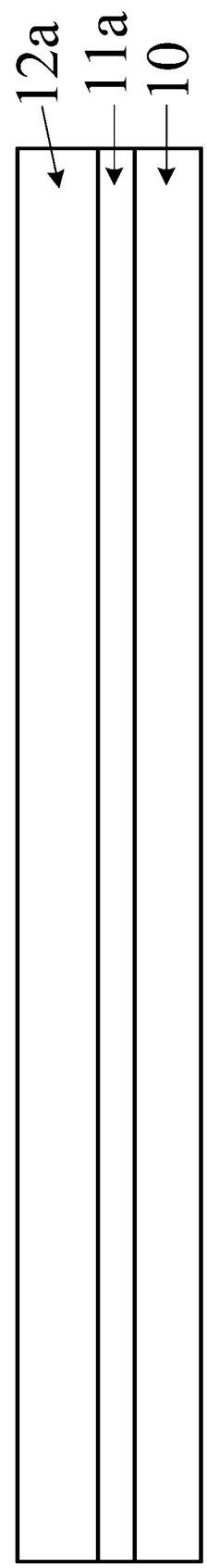
FIG. 4 is a schematic diagram showing forming of a photoresist film according to an embodiment of the present disclosure.

Exemplarily, referring to FIG. 4, which is a schematic view showing forming of the photoresist film according to an embodiment of the present disclosure, the base substrate 10 on which the common electrode film 11a is formed may be coated with a layer of photoresist, to form the photoresist film 12a.

In step 203, the common electrode film and the photoresist film on the base substrate are processed, to obtain the common electrode and the first photoresist pattern.

In an optional implementation, step 203 may include the following steps.

In step A, a gray-scale mask is adopted to perform exposure on the photoresist film, and developing is performed on the photoresist film subjected to exposure to form a second photoresist pattern.

Figure 5:
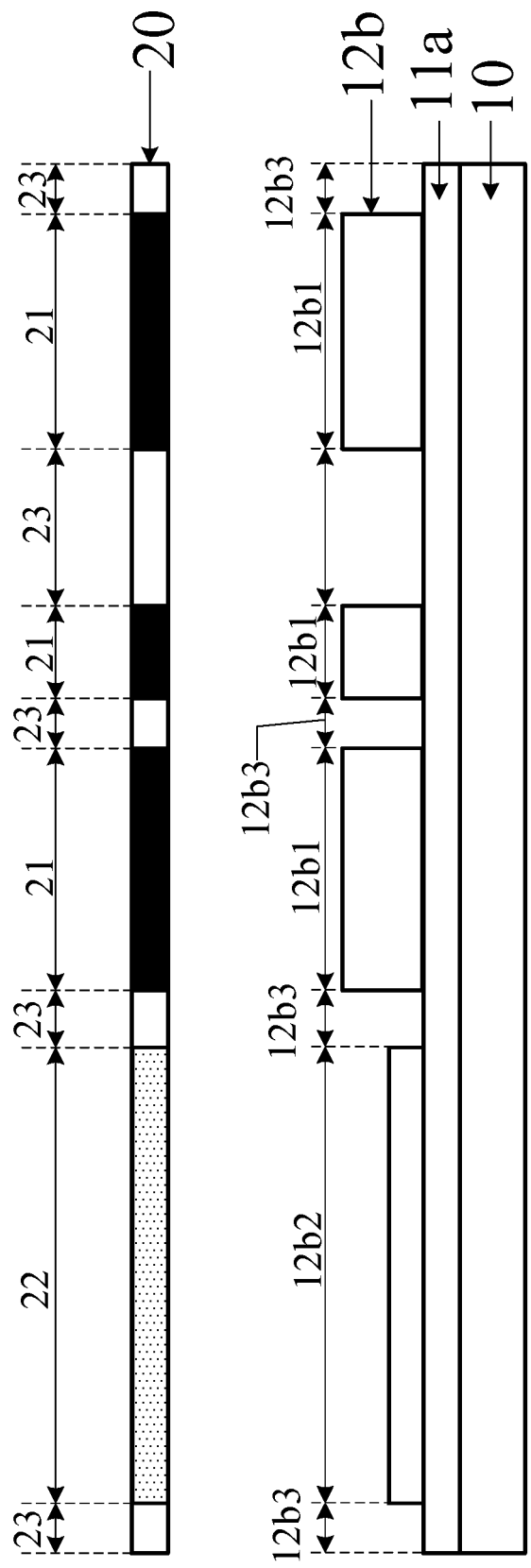
FIG. 5 is a schematic diagram showing forming of a second photoresist pattern according to an embodiment of the present disclosure.

Exemplarily, referring to FIG. 5, which is a schematic view showing forming of the second photoresist pattern according to an embodiment of the present disclosure, in step A, the gray-scale mask plate 20 may be adopted to perform exposure on the photoresist film, and developing is performed on the photoresist film subjected to exposure to form the second photoresist pattern 12b.

The gray-scale mask base 20 may include an opaque region 21, a semi-light-transmitting region 22 and a light-transmitting region 23. The light transmittance of the non-light-transmitting region 21 is less than that of the semi-light-transmitting region 22. The light transmittance of the semi-light-transmitting region 22 is less than that of the light-transmitting region 23. Taking that the photoresist film is made from a positive photoresist as an example, after exposure and developing are performed on the photoresist film, the obtained second photoresist pattern 12b may include a first photoresist region 12b1 and a second photoresist region 12b2. The photoresist in the first photoresist region 12b1 is thicker than the photoresist in the second photoresist region 12b2. The second photoresist region 12b2 may be a pattern formed after the photoresist in a partial region of the photoresist film is completely removed. As the photoresist in the partial region is completely removed, a photoresist completely-removed region 12b3 as shown in FIG. 5 may be formed in the layer where the second photoresist pattern 12b is.

Here, the first photoresist region 12b1 corresponds to the non-light-transmitting region 21 in the gray-scale mask plate 20. The second photoresist region 12b2 corresponds to the semi-light-transmitting region 22 in the gray-scale mask plate. The photoresist completely-removed region 12b3 corresponds to the light-transmitting region 23 in the gray-scale mask plate 20. It should be noted that, when exposure is performed on the photoresist film with the gray-scale mask plate 20, the gray-scale mask plate 20 is suspended above the base substrate 10. Any region of the non-light-transmitting region 21, the semi-light-transmitting region 22 and the light-transmitting region 23 in the gray-scale mask plate 20 and the corresponding region have the same orthographic projection on the base substrate 10.

In step B, a portion of the common electrode film which is not covered by the second photoresist pattern is removed to form the common electrode.

Figure 6:
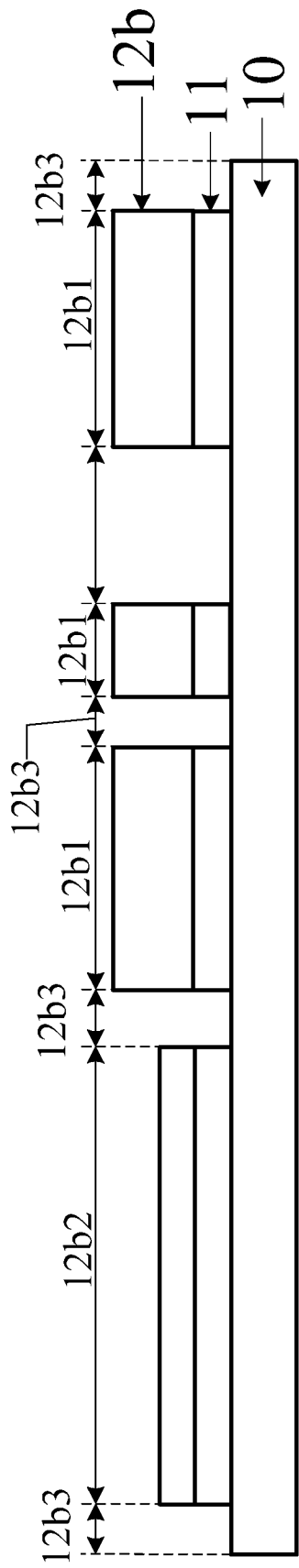
FIG. 6 is a schematic diagram showing forming of a common electrode with a second photoresist pattern according to an embodiment of the present disclosure.

The portion of the common electrode film which is not covered by the second photoresist pattern is: the corresponding portion of the common electrode film where the photoresist is completely removed, that is the portion of the common electrode film which has the same orthographic projection with the photoresist completely-removed region on the base substrate. Exemplarily, referring to FIG. 6, which is a schematic diagram showing forming of the common electrode with the second photoresist pattern according to an embodiment of the present disclosure, in step B, the common electrode film with the second photoresist pattern 12b may be etched to remove portion of the common electrode film which is not covered by the second photoresist pattern. Thus, the common electrode film can be processed to be the common electrode, and therefore the common electrode 11 with the second photoresist pattern 12b may be formed.

In step C, the photoresist in the second photoresist region is removed, and the photoresist in the first photoresist region is thinned to form the first photoresist pattern.

Figure 7:
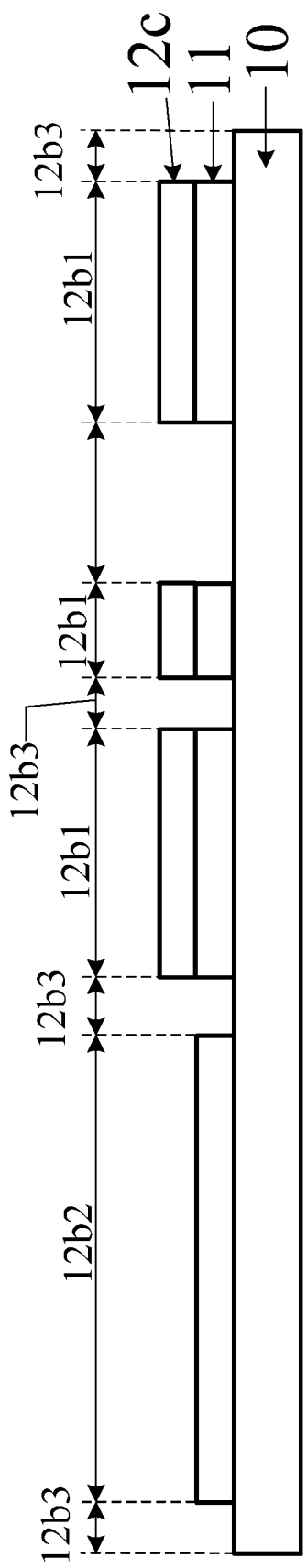
FIG. 7 is a schematic diagram showing forming of a common electrode with a first photoresist pattern according to an embodiment of the present disclosure.

Exemplarily, referring to FIG. 7, which illustrates forming of the common electrode with the first photoresist pattern according to an embodiment of the present disclosure, in step C, ashing process may be performed on the second photoresist pattern to remove the photoresist in the second photoresist region in the second photoresist pattern and to thin the photoresist in the first photoresist region in the second photoresist pattern so as to further process the second photoresist pattern to be the first photoresist pattern 12c.

For example, the base substrate on which the common electrode with the second photoresist pattern is may be placed in a reaction chamber, and mixed gas (for example, oxygen and sulfur hexafluoride) which can make the photoresist ashed is pumped into the second photoresist pattern in the reaction chamber. The gas, after reaching the surface of the second photoresist pattern, can make the second photoresist pattern ashed gradually, and the photoresist in the first photoresist region is thicker than the photoresist in the second first photoresist region. Thus, by controlling the ashing duration, the photoresist in the second photoresist region can be removed and the photoresist in the first photoresist region can be thinned, so as to process the second photoresist pattern to be the first photoresist pattern. The first photoresist pattern may include: the thinned photoresist in the first photoresist region.

Optionally, the thickness of the thinned photoresist in the first photoresist region may be 100-1,000 nm, which means that the thickness of the first photoresist pattern 12c formed through steps A to C may be 100-1,000 nm.

In can be known from step 203 that the common electrode and the first photoresist pattern are formed simultaneously with the same gray-scale mask plate in the embodiments of the present disclosure. Therefore, the manufacturing process of the array substrate can be simplified. In addition, the amount of the mask plates used in the manufacturing process of the array substrate does not increase, and therefore the manufacturing cost of the array substrate will not increase.

In step 204, the first photoresist pattern is processed to form the shielding layer.

Figure 8:
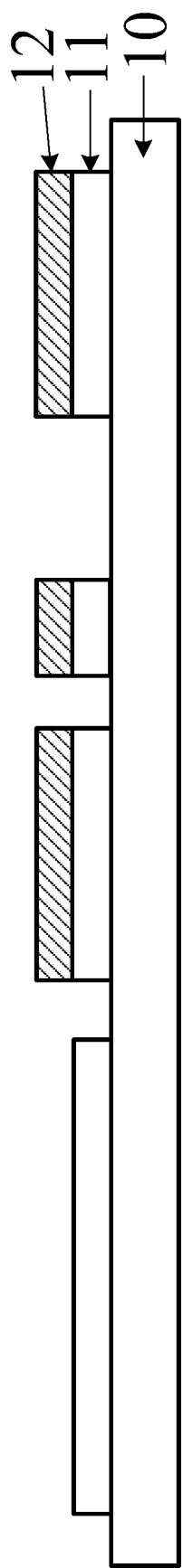
FIG. 8 is a schematic diagram showing forming of a shielding layer according to an embodiment of the present disclosure.

Exemplarily, referring to FIG. 8, which is a schematic view showing forming of the shielding layer according to an embodiment of the present disclosure, the first photoresist pattern is processed to form the shielding layer 12.

The photoresist film is generally light-transmitting, and therefore the first photoresist pattern is also light-transmitting. In step 204, the first light-transmitting photoresist pattern may be processed to be the light-absorbing shielding layer. In addition, when the first photoresist pattern is processed, it needs to guarantee the stable property of the processed photoresist, such that the processed photoresist can maintain the light-absorbing function.

In the embodiment of the present disclosure, the material for forming the photoresist film may include an organic matter (the material for forming the first photoresist pattern may also include an organic matter). Here, the organic matter usually consists of carbon elements, oxygen elements and hydrogen elements. Therefore, processing the first photoresist pattern may include: carbonizing the first photoresist pattern. After the first photoresist pattern is carbonized, at least part of the oxygen elements and at least part of the hydrogen elements in the first photoresist pattern may be removed, such that lots of carbon elements remain in the first photoresist pattern. The first photoresist pattern is roughed on surface and gradually becomes black. Here, first photoresist pattern can absorb the external light.

Exemplarily, when the first photoresist pattern is carbonized, the first photoresist pattern may be heated in the oxygen-free environment (for example, the vacuum environment). When the first photoresist pattern is heated, at least part of the organics decomposes into carbon, water and carbon dioxide. Carbon dioxide is gas, and the decomposed carbon dioxide can directly be separated from the first photoresist pattern. The decomposed water can be separated from the first photoresist pattern by way of evaporation, while carbon remains in the first photoresist pattern. In this case, the at least part of the oxygen elements and at least part of the hydrogen elements in the first photoresist pattern are removed, and the lots of carbon is formed in the first photoresist pattern. Thus, the first photoresist pattern is processed to be the shielding Furthermore, the first photoresist pattern may be heated in a various ways. The embodiment of the present disclosure takes the following two implementations for illustration.

In some implementations of the present disclosure, the first photoresist pattern may be bombarded with ions in the oxygen-free environment (for example, the vacuum environment). After the first photoresist pattern has been bombarded with ions, the energy of the ions can transfer to the first photoresist pattern, to heat the first photoresist pattern. In the embodiment of the present disclosure, the first photoresist pattern may be bombarded with high-energy ions, e.g., helium ions or nitrogen ions, in the oxygen-free environment, such that the first photoresist pattern generates heat. Optionally, in the embodiments of the present disclosure, the first photoresist pattern may be bombarded with ions through a dry-etching equipment. Exemplarily, the cavity of the dry-etching equipment may be vacuumized first. Then, the base substrate formed with the first photoresist pattern may be placed in the cavity, and the first photoresist pattern is bombarded with ions through the equipment.

It should be noted that the ADS array substrate has a common electrode, and a photoresist film usually needs to be formed on the common electrode film during the process of forming the common electrode. Then, the common electrode film is processed with the photoresist film to form the common electrode. In the embodiments of the present disclosure, the shielding layer is formed with the photoresist film which is formed on the common electrode film when the common electrode is formed. Thus, there is no need to provide a new photoresist film, thereby reducing the manufacturing cost of the array substrate.

In step 205, a gate conducting layer is formed on the shielding layer.

Optionally, the gate conducting layer may be made of a metal material, e.g., molybdenum (Mo), copper (Cu), aluminum (Al) or an alloy material.

Figure 9:
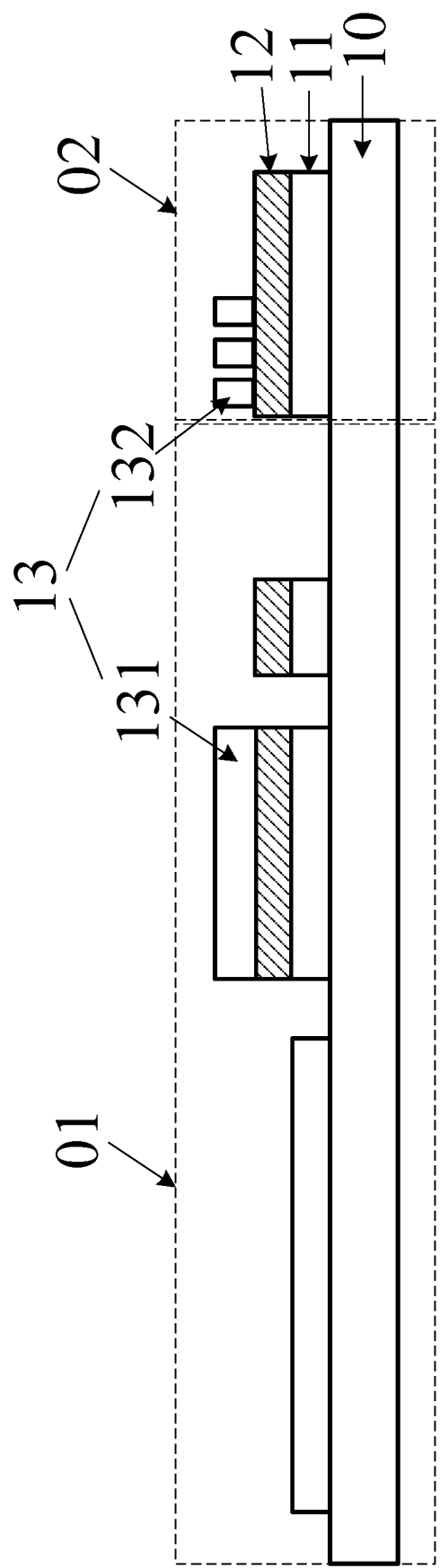
FIG. 9 is a schematic diagram showing forming of a gate conducting layer according to an embodiment of the present disclosure.

Exemplarily, referring to FIG. 9, which is a schematic view showing forming of the gate conducting layer according to an embodiment of the present disclosure, in step 205, a gate metal layer is formed on the base substrate 10, on which the shielding layer 11 is formed, by means of any of deposition, coating, sputtering, etc. Then, a single patterning process which may include photoresist coating, exposure, developing, etching and photoresist stripping is performed on the gate metal layer to form the gate conducting layer 13. Generally, the array substrate is provided with a display region and a non-display region other than the display region (FIG. 9 only shown part of the display region and part of the non-display region). Here, the non-display region of the array substrate may be a region, close to a side edge, on the surface of the array substrate. The non-display region surrounds the display region. The display region is also called an AA (Active Area) or a pixel region. The non-display region is also called a peripheral region.

In the embodiment of the present disclosure, as shown in FIG. 9, the gate conducting layer 13 may include a gate 131 and a gate line 132. The array substrate may include a pixel region 01 and a peripheral region 02. The gate 131 is usually in the pixel region 01 (or a part of the gate 131 is in the pixel region 01, and the part of the gate is in the peripheral region 02). The gate line 132 is usually disposed in the peripheral region 02 and the pixel region 01 (FIG. 9 only shown the gate line in the peripheral region 02).

In the embodiment of the present disclosure, the orthographic projection of the gate conducting layer 13 on the base substrate 10 is within the orthographic projection of the shielding layer 12 on the base substrate 10. That is, the orthographic projections of the gate 131 and the gate line 132 on the base substrate 10 are within the orthographic projection of the shielding layer 12 on the base substrate 10.

In step 206, a gate insulating layer is formed on the base substrate on which the gate conducting layer is formed.

Optionally, the gate insulating layer may be made from an insulating material, such as silicon dioxide, silicon nitride or a mixed material (for example, a mixed material of silicon dioxide and silicon nitride).

Figure 10:
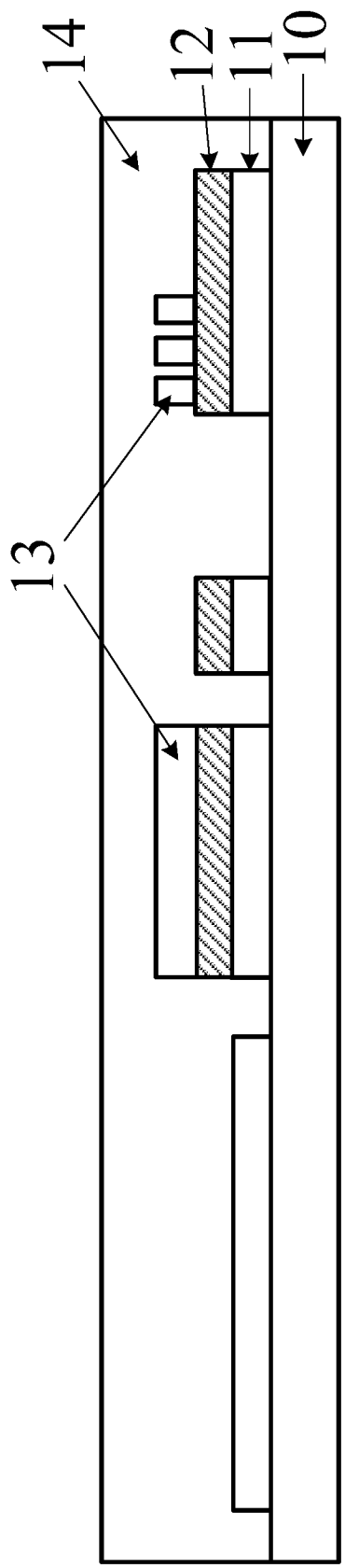
FIG. 10 is a schematic diagram showing forming of a gate insulating layer according to an embodiment of the present disclosure.

Exemplarily, referring to FIG. 10, which is a schematic view showing forming of the gate insulating layer according to an embodiment of the present disclosure. The gate insulating layer 14 is formed on the base substrate, on which the gate conducting layer 13 is formed, by means of any of deposition, coating, sputtering, etc.

In step 207, an active layer is formed on the gate insulating layer.

Optionally, the active layer may be made from a semiconductor material, such as non-crystalline silicon or polycrystalline silicon.

Figure 11:
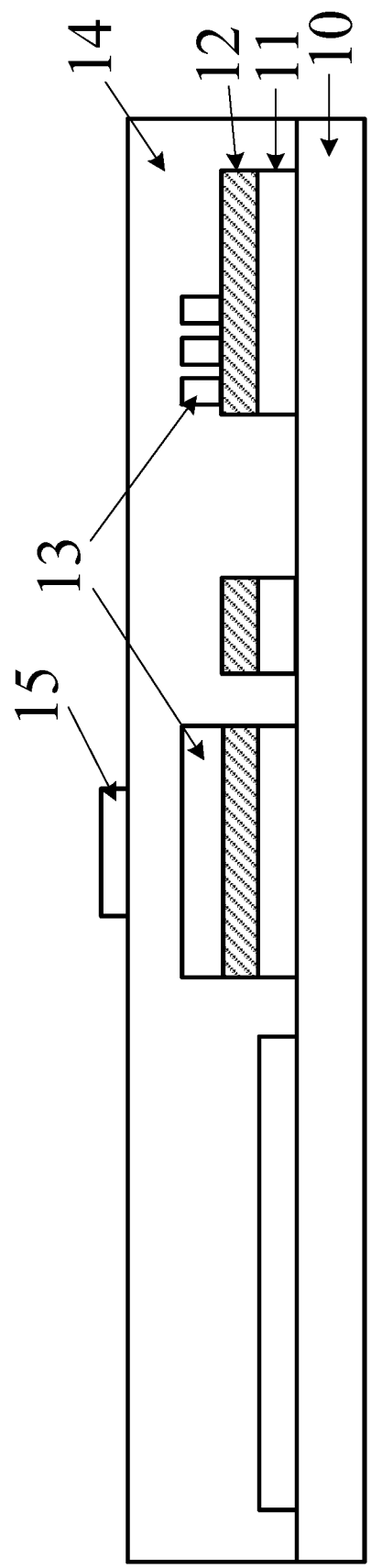
FIG. 11 is a schematic diagram showing forming of an active layer according to an embodiment of the present disclosure.

Exemplarily, referring to FIG. 11, which is a schematic view showing forming of the active layer according to an embodiment of the present disclosure, in step 207, the active layer film may be first formed on the base substrate 10, on which the gate insulating layer 14 is formed, by means of any of deposition, coating, sputtering, etc. Then, a single patterning process which may include photoresist coating, exposure, developing, etching and photoresist stripping is performed on the active layer film to form an active layer 15.

In step 208, a source/drain conducting layer is formed on the base substrate on which the active layer pattern is formed.

Optionally, the source/drain conducting layer may be made of a metal material, e.g., Mo, Cu, Al or an alloy material.

Figure 12:
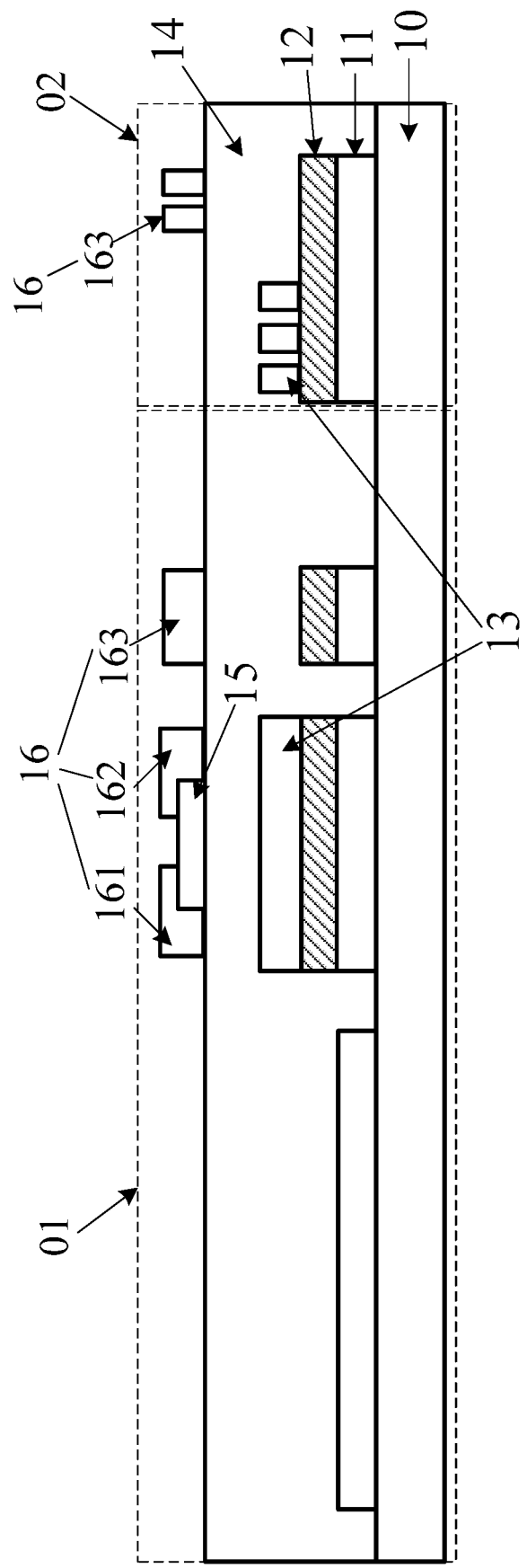
FIG. 12 is a schematic diagram showing forming of a source/drain conducting layer according to an embodiment of the present disclosure.

Exemplarily, referring to FIG. 12, which is a schematic view showing forming of the source/drain conducting layer according to an embodiment of the present disclosure, in step 208, a source/drain metal layer is formed on the base substrate 10, on which the active layer 15 is formed, by means of any of deposition, coating, sputtering, etc. Then, a single patterning process which may include photoresist coating, exposure, developing, etching and photoresist stripping is performed on the source/drain metal layer to form the source/drain conducting layer 16.

In the embodiment of the present disclosure, as shown in FIG. 12, the source/drain conducting layer 16 may include a source 161, a drain 162 and a data line 163. The source 161 and the drain 162 are usually disposed in the pixel region 01. The data line 163 is usually disposed in the pixel region 01 and the peripheral region 02. In the embodiment of the present disclosure, the orthographic projection of the source/drain conducting layer 16 on the base substrate 10 is within the orthographic projection of the shielding layer 12 on the base substrate 10. That is, the orthographic projections of the source 161, the drain 162 and the data line 163 on the base substrate 10 are within the orthographic projection of the shielding layer 12 on the base substrate 10.

After the source/drain conducting layer is formed, the purpose of forming the transistor device layer on the base substrate is achieved. The transistor device layer may include: the above gate conducting layer, the gate insulating layer, the active layer and the source/drain conducting layer. In addition, the gate conducting layer and the source/drain conducting layer are both conductors in the transistor device layer. It can be seen that the orthographic projection of the conductor in the transistor device layer on the base substrate is within the orthographic projection of the shielding layer on the base substrate.

In step 209, a passivation layer is formed on the base substrate on which the source/drain conducting layer is formed.

Optionally, the passivation layer may be made from insulating materials, such as silicon dioxide or silicon nitride.

Figure 13:
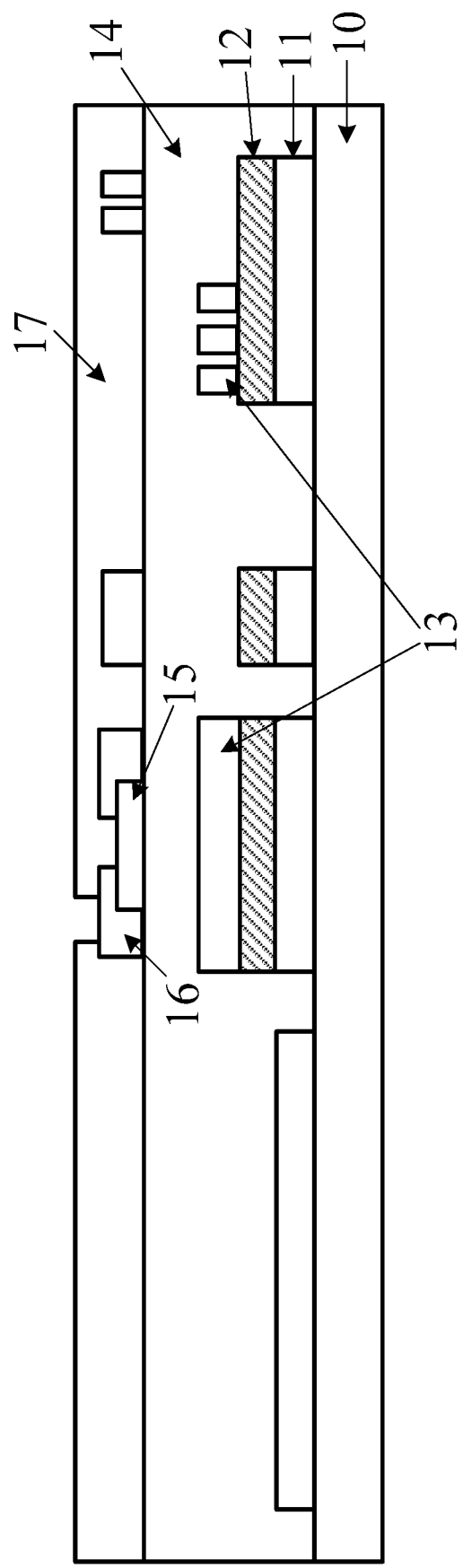
FIG. 13 is a schematic diagram showing forming of a passivation layer according to an embodiment of the present disclosure.

Exemplarily, referring to FIG. 13, which is a schematic view showing forming of the passivation layer according to an embodiment of the present disclosure, in step 209, a passivation layer film may be first formed on the base substrate 10, on which the source/drain conducting layer 16 is formed, by means of any of deposition, coating, sputtering, etc. Then, a single patterning process which may include photoresist coating, exposure, developing, etching and photoresist stripping is performed on the passivation layer film to form the passivation layer 17.

In step 210, a pixel electrode is formed on the passivation layer.

Optionally, the pixel electrode may be made from ITO.

Figure 14:
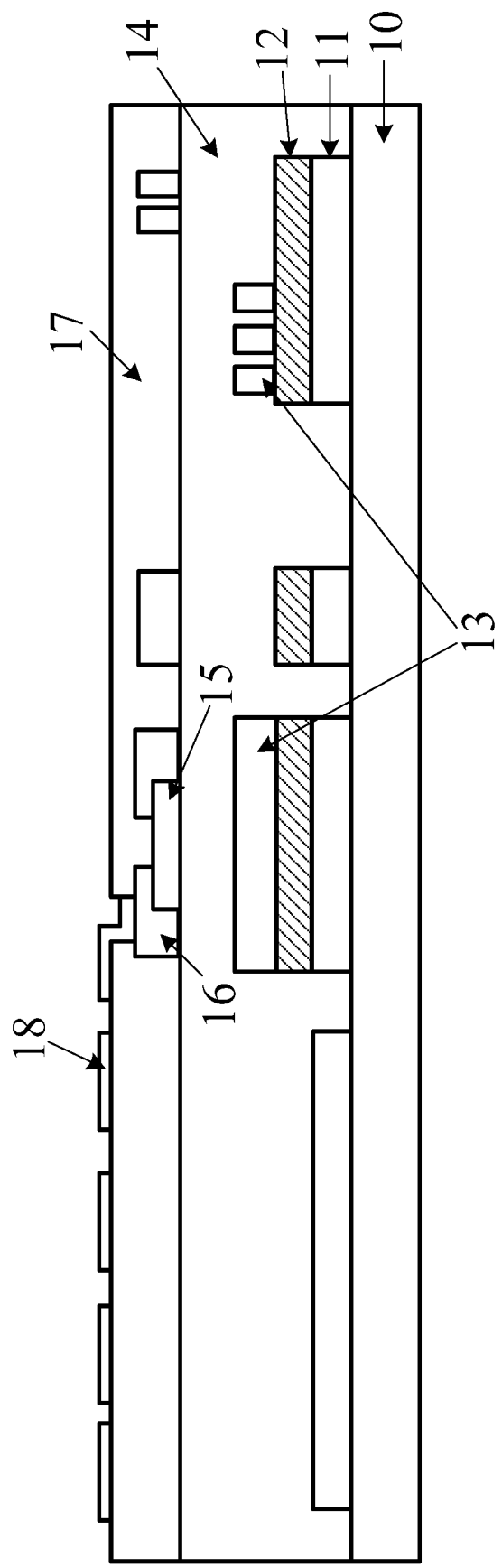
FIG. 14 is a schematic diagram showing forming of a pixel electrode according to an embodiment of the present disclosure.

Exemplarily, referring to FIG. 14, which is a schematic view showing forming of the pixel electrode according to an embodiment of the present disclosure, in step 210, a pixel electrode film may be first formed on the base substrate 10, on which the passivation layer 17 is formed, by means of any of deposition, coating, sputtering, etc. Then, a single patterning process which may include photoresist coating, exposure, developing, etching and photoresist stripping is performed on the pixel electrode film to form the pixel electrode 18.

It should be noted that the embodiment of the present disclosure is illustrated by taking an example in which the photoresist film formed in step 202 is light-transmitting. Optionally, if the photoresist film formed in step 202 is non-light-transmitting (for example, black photoresist), the formed first photoresist pattern is the shielding layer. Therefore, after the first photoresist pattern is formed, there is no need to execute step 204.

In addition, the embodiment of the present disclosure is illustrated by taking the manufacture of an ADS array substrate as an example. Optionally, if the TN array substrate is manufactured in the embodiment of the present disclosure, as the TN array substrate does not include a common electrode, there is no need to execute step 201. Additionally, in step 202, the photoresist film may be directly formed on the base substrate. Structures on the base substrate before step 203 only include the photoresist film. In step 203, the target structure obtained by processing the existing structures only includes the first photoresist pattern. In step 203, when the photoresist film is processed to be the first photoresist pattern, exposure and developing may be directly performed on the photoresist film with a mask plate, to form the first photoresist pattern. Here, the mask plate may be obtained by changing the semi-light-transmitting region in the gray-scale mask plate adopted in step 203 to the light-transmitting region.

In summary, in the manufacturing method of the array substrate according to the embodiment of the present disclosure, the shielding layer and the transistor device layer are sequentially formed on the base substrate. The orthographic projection of the conductor in the transistor device layer on the base substrate is within the orthographic projection of the shielding layer on the base substrate. The shielding layer can absorb external light and is between the base substrate and the transistor device layer. Therefore, the shielding layer can external light of the display device where the array substrate is located from irradiating the conductor in the transistor device layer, and can absorb the external light. Thus, light reflections at the side of the array substrate where the base substrate is located is eliminated. In addition, the shielding layer is made of photoresist and is relatively simple in forming process. Therefore, there is no need to perform the anti-reflective treatment on the transistor device layer. Thus, the process for manufacturing the array substrate is simplified.

An embodiment of the present disclosure further provides an array substrate. Referring to FIG. 5, which is a structural schematic view of an array substrate according to the embodiment of the present disclosure, the array substrate may include: a base substrate 10, and a shielding layer 12 and a transistor device layer (not shown in FIG. 15) sequentially disposed on the base substrate 10 along a direction away from the base substrate.

Here, the orthographic projection of the conductor in the transistor device layer on the base substrate 10 is within the orthographic projection of the shielding layer 12 on the base substrate 10. The shielding layer 12 absorbs light and is made of photoresist.

Figure 15:
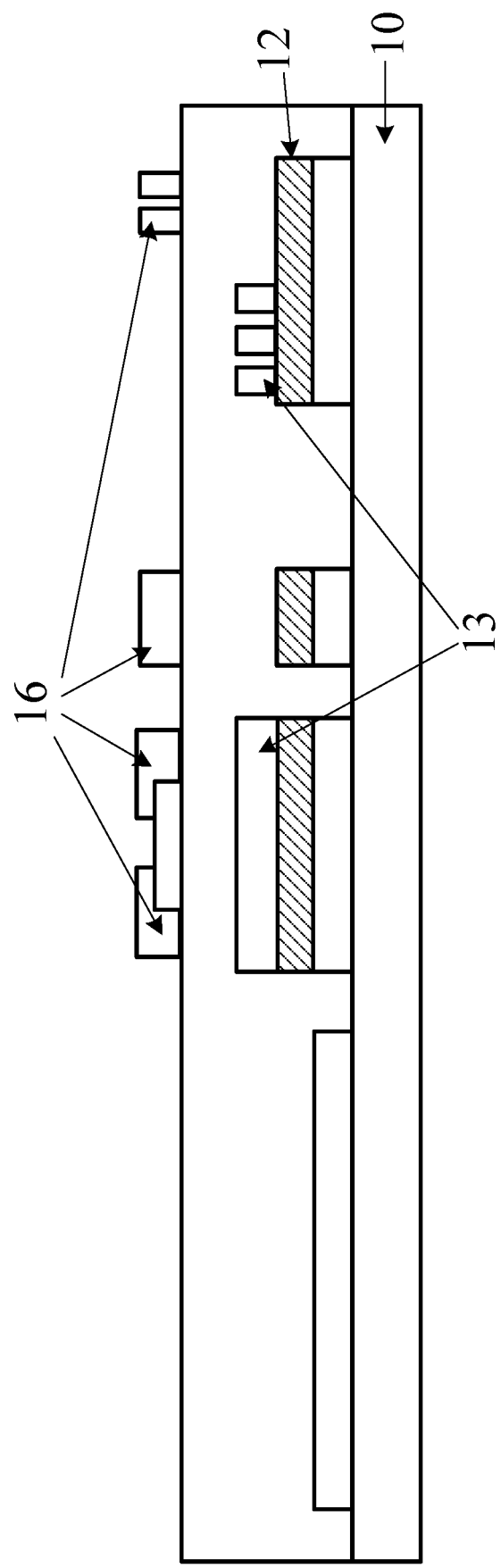
FIG. 15 is a structural schematic diagram of an array substrate according to an embodiment of the present disclosure.

Optionally, please continue to refer to FIG. 15, the conductor in the transistor device layer generally may include a gate conducting layer 13 and a source/drain conducting layer 16. Furthermore, the gate conducting layer 13 may include a gate and a gate line, and the source/drain conducting layer may include a source, a drain and a data line.

In summary, in the array substrate according to the embodiment of the present disclosure, the shielding layer and the transistor device layer are sequentially formed on the base substrate. The orthographic projection of the conductor in the transistor device layer on the base substrate is within the orthographic projection of the shielding layer on the base substrate. The shielding layer can absorb external light and is between the base substrate and the transistor device layer. Therefore, the shielding layer can external light of the display device where the array substrate is located from irradiating the conductor in the transistor device layer, and can absorb the external light. Thus, light reflections at the side of the array substrate where the base substrate is located is eliminated. In addition, the shielding layer is made of photoresist and is relatively simple in forming process. Therefore, there is no need to perform the anti-reflective treatment on the transistor device layer. Thus, the process for manufacturing the array substrate is simplified.

Figure 16:
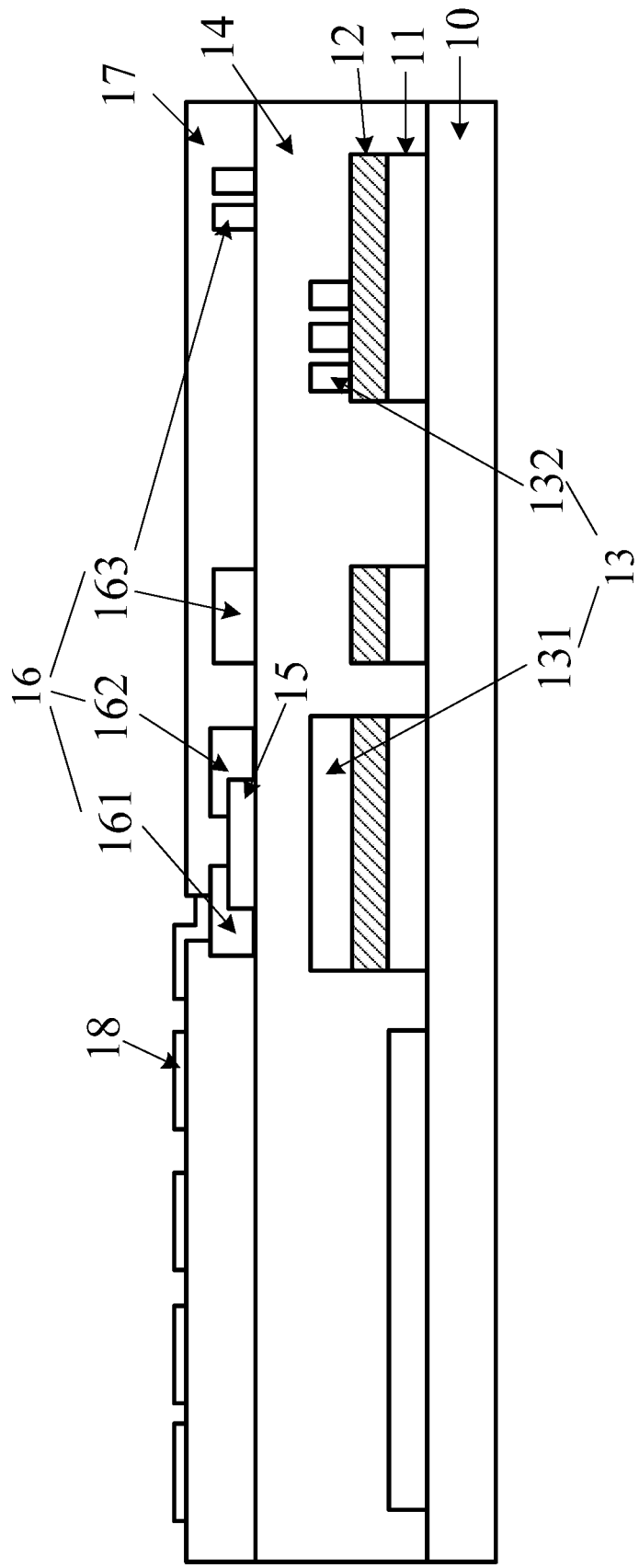
FIG. 16 is a structural schematic diagram of another array substrate according to an embodiment of the present disclosure.

Optionally, referring to FIG. 16, which is a structural schematic view of another array substrate according to an embodiment of the present disclosure, the array substrate may further include a common electrode 11 between the base substrate 10 and the shielding layer 12. The orthographic projection of the shielding layer 12 on the base substrate 10 may be within the orthographic projection of the common electrode 11 on the base substrate 10.

Optionally, as shown in FIG. 16, the transistor device layer in the array substrate may include a gate conducting layer 13, a gate insulating layer 14, an active layer 15 and a source/drain conducting layer 16, which are sequentially disposed on the shielding layer 12 along the direction away from the base substrate 10. The gate conducting layer 13 may include a gate 131 and a gate line 132. The source/drain conducting layer 16 includes a source 161, a drain 162 and a data line 163.

Optionally, as shown in FIG. 16, the array substrate may further include a passivation layer 17 and a pixel electrode 18 on the transistor device layer (for example on the source/drain conducting layer 16 in the transistor device layer.

Optionally, the thickness of the shielding layer 12 may be 100-1,000 nm.

It should be noted that FIG. 15 and FIG. 16 are shown by taking an example in which the array substrate provided in the embodiments of the present disclosure is an ADS array substrate. Optionally, the array substrate provided in the embodiments of the present disclosure may also be a TN array substrate. In this case, the TN array substrate does not include a common electrode.

It can be clearly understood by those skilled in the art that for the convenience and conciseness of description, the specific manufacturing process and the specific principle of the array substrate described above may be made reference to the corresponding processes in the foregoing method embodiments (for example, the method embodiment shown in FIG. 1 or FIG. 2), and will not be repeated herein.

In summary, in the array substrate according to the embodiment of the present disclosure, the shielding layer and the transistor device layer are sequentially formed on the base substrate. The orthographic projection of the conductor in the transistor device layer on the base substrate is within the orthographic projection of the shielding layer on the base substrate. The shielding layer can absorb external light and is between the base substrate and the transistor device layer. Therefore, the shielding layer can external light of the display device where the array substrate is located from irradiating the conductor in the transistor device layer, and can absorb the external light. Thus, light reflections at the side of the array substrate where the base substrate is located is eliminated. In addition, the shielding layer is made of photoresist and is relatively simple in forming process. Therefore, there is no need to perform the anti-reflective treatment on the transistor device layer. Thus, the process for manufacturing the array substrate is simplified.

An embodiment of the present disclosure further provides a display panel which may include the array substrate shown in FIG. 15 or FIG. 16.

Figure 17:
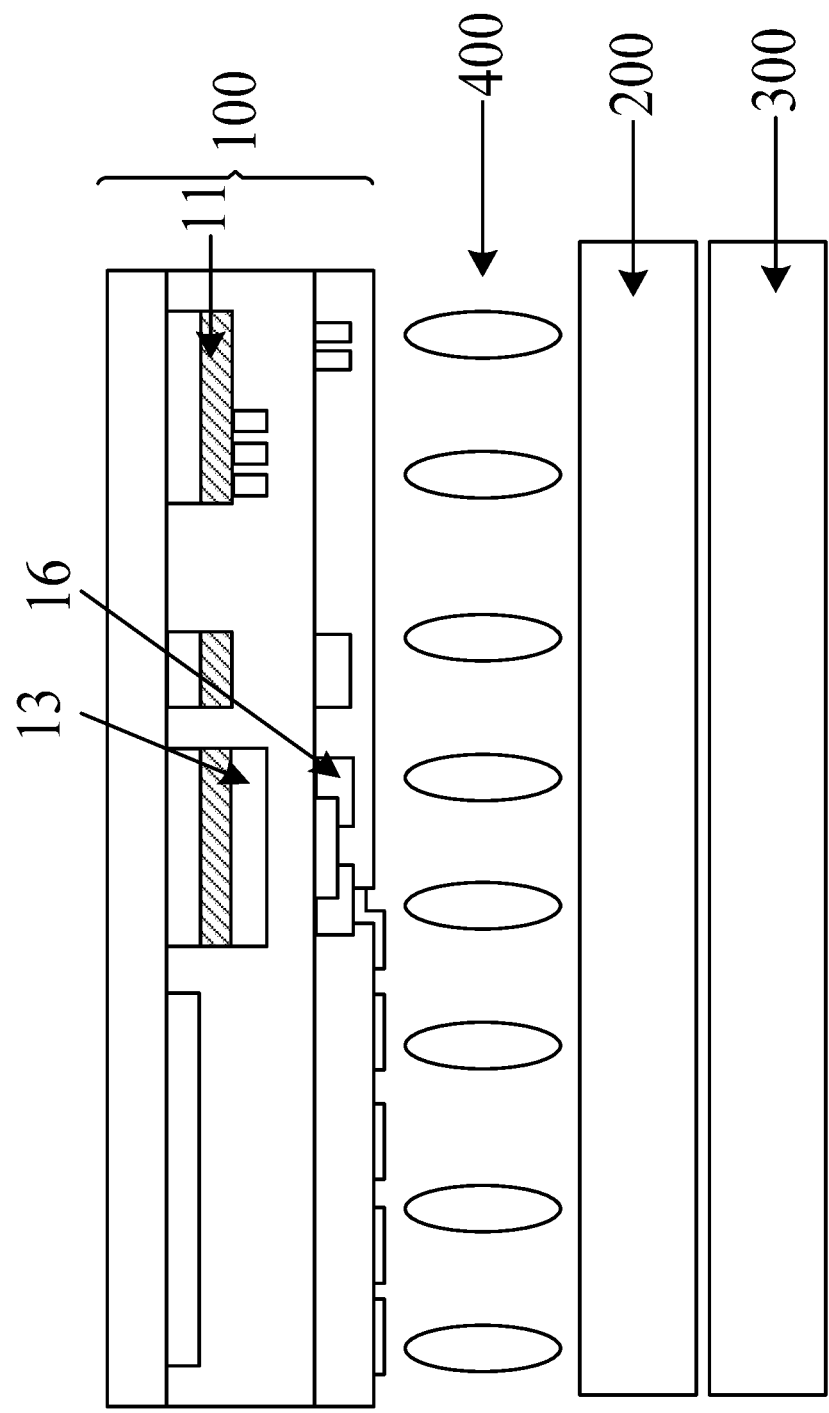
FIG. 17 is a structural schematic diagram of a display device according to an embodiment of the present disclosure.

As shown in FIG. 17, which is a structural schematic view of the display device according to an embodiment of the present disclosure, the display panel in the embodiment of the present disclosure may further include the array substrate 100 as shown in FIG. 17, a color film substrate 200, and a liquid crystal layer 400 between the color film substrate 200 and the array substrate 100. The array substrate 100 may be the array substrate shown in FIG. 15 or FIG. 16 (FIG. 17 is shown by taking the array substrate in FIG. 16 as an example). The color film substrate 200, the liquid crystal layer 400, and the array substrate 100 are sequentially laminated. The transistor device layer (the transistor device layer includes the gate conducting layer 13 and the source/drain conducting layer 16) in the array substrate 100 is closer to the color film substrate 200 than the shielding layer 11.

FIG. 17 is shown by taking an example in which the display panel in the embodiments of the present disclosure is a liquid crystal display panel including an ADS array substrate. Optionally, the display panel in the embodiments of the present disclosure may also be liquid crystal display panel including a TN array substrate.

The embodiments of the present disclosure further provide a display device, which may include the display panel provided in the embodiments of the present disclosure.

Optionally, when the display panel provided in the embodiments of the present disclosure is a liquid crystal display panel, the display panel provided in the embodiments of the present disclosure may include a backlight source. As shown in FIG. 17, the backlight source 300 may be at the side, away from the array substrate 100, of the color film substrate 200 in the display panel.

Exemplarily, the display device may be any products or parts with a display function, for example an electronic paper, a mobile phone, a tablet PC, a television, a display, a laptop, a digital photo frame and a navigator.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A manufacturing method of an array substrate, comprising:
    forming a shielding layer on a base substrate, wherein the shielding layer absorbs light and is made of photoresist;
    forming a transistor device layer on the base substrate on which the shielding layer is formed, wherein an orthographic projection of a conductor in the transistor device layer on the base substrate is within an orthographic projection of the shielding layer on the base substrate; and
    forming a common electrode between the base substrate and the shielding layer, wherein an orthographic projection of the shielding layer on the base substrate is within an orthographic projection of the common electrode on the base substrate.

2. The manufacturing method according to claim 1, wherein forming the shielding layer on the base substrate comprises:
    forming a first photoresist pattern on the base substrate; and
    processing the first photoresist pattern to form the shielding layer.

3. The manufacturing method according to claim 2, wherein processing the first photoresist pattern comprises:
    carbonizing the first photoresist pattern.

4. The manufacturing method according to claim 2, wherein forming the first photoresist pattern on the base substrate comprises:
    sequentially forming a common electrode film and a photoresist film on the base substrate;
    sequentially performing exposure and developing on the photoresist film to form a second photoresist pattern, the second photoresist pattern comprising a first photoresist region and a second photoresist region, and photoresist in the first photoresist region being thicker than photoresist in the second photoresist region;
    removing a portion of the common electrode film which is not covered by the second photoresist pattern to form a common electrode; and
    removing the photoresist in the second photoresist region, and thinning the photoresist in the first photoresist region to form the first photoresist pattern.

5. The manufacturing method according to claim 4, wherein removing the portion of the common electrode film which is not covered by the second photoresist pattern comprises:
    etching the portion of the common electrode film which is not covered by the second photoresist pattern to remove the portion of the common electrode film which is not covered by the second photoresist pattern.

6. The manufacturing method according to claim 4, wherein removing the photoresist in the second photoresist region, and thinning the photoresist in the first photoresist region comprises:
    performing an ashing process on the second photoresist pattern to remove the photoresist in the second photoresist region and to thin the photoresist in the first photoresist region.

7. The manufacturing method according to claim 1, wherein
    forming the transistor device layer on the base substrate on which the shielding layer is formed comprises:
    sequentially forming a gate conducting layer, a gate insulating layer, an active layer and a source/drain conducting layer on the base substrate on which the shielding layer is formed,
    wherein the conductor in the thin film transistor device layer comprises the gate conducting layer and the source/drain conducting layer.

8. The manufacturing method according to claim 7, wherein after forming the transistor device layer on the base substrate on which the shielding layer is formed, the method further comprises:
    sequentially forming a passivation layer and a pixel electrode on the transistor device layer.

9. An array substrate, comprising
    a base substrate, and a shielding layer and a transistor device layer sequentially disposed on the base substrate along a direction away from the base substrate, wherein an orthographic projection of a conductor in the transistor device layer on the base substrate is within an orthographic projection of the shielding layer on the base substrate, and the shielding layer absorbs light and is made of photoresist; and
    a common electrode between the base substrate and the shielding layer, wherein an orthographic projection of the shielding layer on the base substrate is within an orthographic projection of the common electrode on the base substrate.

10. The array substrate according to claim 9, wherein
    the transistor device layer comprises a gate conducting layer, a gate insulating layer, an active layer and a source/drain conducting layer which are sequentially disposed on the shielding layer along the direction away from the base substrate; and the conductor in the transistor device layer comprises: the gate conducting layer and the source/drain conducting layer.

11. The array substrate according to claim 9, further comprising: a passivation layer and a pixel electrode sequentially disposed on the transistor device layer along the direction away from the base substrate.

12. A display panel, wherein an array substrate in the display panel comprises: a base substrate, and a shielding layer and a transistor device layer sequentially disposed on the base substrate, wherein an orthographic projection of a conductor in the transistor device layer on the base substrate is within an orthographic projection of the shielding layer on the base substrate, and the shielding layer absorbs light and is made of photoresist; and
    the array substrate in the display panel further comprises:
        a common electrode between the base substrate and the shielding layer, wherein an orthographic projection of the shielding layer on the base substrate is within an orthographic projection of the common electrode on the base substrate.

13. The display panel according to claim 12, further comprising: a color film substrate and a liquid crystal layer, wherein
   the color film substrate, the liquid crystal layer and the array substrate are sequentially disposed, and the transistor device layer in the array substrate is closer to the color film substrate than the shielding layer in the array substrate.

14. The manufacturing method according to claim 3, wherein carbonizing the first photoresist pattern comprises:
   heating the first photoresist pattern in an oxygen-free environment.

15. The manufacturing method according to claim 14, wherein heating the first photoresist pattern comprises:
   bombarding the first pbotoresist pattern with ions to heat the first photoresist pattern.

16. The array substrate according to claim 9, wherein the shielding layer is 100-1,000 nm in thickness.

17. A display device, comprising: a backlight source and the display panel according to claim 12, wherein the backlight source is at a side, away from the array substrate, of the color film substrate of the display panel.

\* \* \* \* \*